United States Patent
Wensel

(10) Patent No.: US 6,583,504 B2
(45) Date of Patent: *Jun. 24, 2003

(54) SEMICONDUCTOR DIE WITH ATTACHED HEAT SINK AND TRANSFER MOLD

(75) Inventor: Richard W. Wensel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/077,451

(22) Filed: Feb. 14, 2002

(65) Prior Publication Data

US 2002/0074648 A1 Jun. 20, 2002

Related U.S. Application Data

(60) Continuation of application No. 09/837,038, filed on Apr. 18, 2001, now Pat. No. 6,373,132, which is a continuation of application No. 09/302,343, filed on Apr. 29, 1999, now Pat. No. 6,249,050, which is a continuation of application No. 08/909,228, filed on Aug. 11, 1997, now Pat. No. 5,959,349, which is a division of application No. 08/804,911, filed on Feb. 25, 1997, now Pat. No. 6,001,672.

(51) Int. Cl.[7] ............................................. H01L 23/34
(52) U.S. Cl. ....................................................... 257/712
(58) Field of Search ................................. 257/712, 713, 257/646, 675, 667, 684, 796; 438/124; 264/272.17

(56) References Cited

U.S. PATENT DOCUMENTS

| | | |
|---|---|---|
| 4,862,245 A | 8/1989 | Pashby et al. |
| 4,984,059 A | 1/1991 | Kubota et al. |
| 5,108,955 A | 4/1992 | Ishida et al. |
| 5,184,208 A | 2/1993 | Sakuta et al. |
| 5,218,759 A | 6/1993 | Juskey et al. |
| 5,252,853 A | 10/1993 | Michii |
| 5,286,679 A | 2/1994 | Farnworth et al. |
| 5,304,842 A | 4/1994 | Farnworth et al. |
| 5,318,677 A | 6/1994 | Hirbour et al. |
| 5,344,795 A | 9/1994 | Hashemi et al. |
| 5,366,933 A | 11/1994 | Golwalkar et al. |
| 5,367,196 A | 11/1994 | Mahulikar et al. |
| 5,369,056 A | 11/1994 | Burns et al. |
| 5,440,169 A | 8/1995 | Tomita et al. |
| 5,441,684 A | 8/1995 | Lee |
| 5,442,234 A | 8/1995 | Liang |
| 5,461,255 A | 10/1995 | Chan et al. |
| 5,470,892 A | 11/1995 | Gupta et al. |
| 5,471,366 A | 11/1995 | Ozawa |
| 5,530,295 A | 6/1996 | Mehr |
| 5,550,711 A | 8/1996 | Burns et al. |
| 5,592,735 A | 1/1997 | Ozawa et al. |
| 5,596,231 A | 1/1997 | Combs |
| 5,598,034 A | 1/1997 | Wakefield |
| 5,604,376 A | 2/1997 | Hamburgen et al. |
| 5,652,461 A | 7/1997 | Ootsuki et al. |
| 5,675,182 A | 10/1997 | Moscicki |
| 5,693,984 A | 12/1997 | Ootsuki |
| 5,719,442 A | 2/1998 | Otsuki |
| 5,796,160 A | 8/1998 | Kuzono |
| 5,801,074 A | 9/1998 | Kim et al. |
| 5,807,768 A | 9/1998 | Shin |
| 5,891,759 A | 4/1999 | Otsuki |
| 5,986,336 A | 11/1999 | Tomita |
| 6,002,173 A | 12/1999 | Casati et al. |
| 6,107,690 A | 8/2000 | Courtenay et al. |

FOREIGN PATENT DOCUMENTS

| | | |
|---|---|---|
| JP | 55-128835 | 10/1980 |
| JP | 56-133857 | 10/1981 |
| JP | 56-4241 | 1/1987 |
| JP | 62-109326 | 5/1987 |
| JP | 62-115834 | 5/1987 |
| JP | 62-261133 | 11/1987 |
| JP | 2-306639 | 12/1990 |

*Primary Examiner*—Alexander O. Williams
(74) *Attorney, Agent, or Firm*—TraskBritt

(57) ABSTRACT

A semiconductor device includes a heat sink adjacent to a die. A dam is positioned at the peripheral edges of the heat sink. During a transfer molding process, the dam serves two purposes. First, the dam prevents damage to the mold. Second, the dam prevents encapsulant packaging compound material from flowing onto the heat sink. The dam may be a gasket. The dam may also be a burr created by, for example, stamping the bottom of the heat sink. The dam may include copper, polyamides, and leadlock tape. The dam may be permanently connected to the heat sink for removal following packaging. The dam may be removed mechanically, through the use of heat, or during an electrolytic deflash cycle.

9 Claims, 6 Drawing Sheets

SEMICONDUCTOR DIE WITH ATTACHED HEAT SINK AND TRANSFER MOLD

CROSS-REFERENCE TO RELATED APPLICATIONS

This application is a continuation of application Ser. No. 09/837,038, filed Apr. 18, 2001, now U.S. Pat. No. 6,373,132 B2, issued Apr. 16, 2002, which is a continuation of application Ser. No. 09/302,343, filed Apr. 29, 1999, now U.S. Pat. No 6,249,050 B1, issued Jun. 19, 2001, which is a continuation of application Ser. No. 08/909,228, filed Aug. 11, 1997, now U.S. Pat. No. 5,959,349, issued Sep. 28, 1999, which is a divisional of application Ser. No. 08/804,911, filed Feb. 25, 1997, now U.S. Pat. No 6,001,672, issued Dec. 14, 1999.

BACKGROUND OF THE INVENTION

Field of the Invention: The present invention relates to the transfer molding of semiconductor devices. More specifically, the present invention relates to a method of using a dam in transfer molding encapsulation of a semiconductor device and a heat sink, and in the resulting semiconductor device assembly.

State of the Art: A semiconductor integrated circuit (IC) device (referred to as a die or chip) includes bond pads on the active surface thereof for interfacing the integrated circuits of the semiconductor device with other circuits outside the die located on differing substrates. Since the semiconductor devices are relatively small and the attendant bond pads on the active surface thereof are, in comparison, considerably smaller, lead frames having a plurality of leads thereon connected to the bond pads of a semiconductor device are used to connect the semiconductor device with other circuits on differing substrates.

In a conventional lead frame design for use with an integrated circuit semiconductor device, the lead frame includes a plurality of leads having their ends terminating adjacent a side or edge of the integrated circuit semiconductor device with the device being supported by the die paddle portion of the lead frame. Electrical connections are made by means of wire bonds extending between the leads of the lead frame and the bond pads located on the active surface of the integrated circuit semiconductor device.

Subsequent to the wire bonding operation, portions of the leads of the lead frame and the integrated circuit semiconductor device may be encapsulated in suitable plastic material to form a packaged semiconductor device assembly. The leads and lead frame are then trimmed and formed to the desired configuration after the packaging of the semiconductor device in the encapsulant material.

In a Leads-Over-Chip (LOC) type lead frame configuration for an integrated circuit semiconductor (IC) device assembly, the leads of the lead frame extend over the active surface of the semiconductor device being insulated therefrom by tape which is adhesively bonded to the semiconductor device and the leads of the lead frame. Electrical connections are made between the leads of the lead frame and bond pads on the active surface of the semiconductor device by way of wire bonds extending therebetween. After wire bonding, the leads of the LOC lead frame and the semiconductor device are encapsulated in suitable plastic to encapsulate the semiconductor device and portions of the leads. Subsequently, the leads are trimmed and formed to the desired configuration to complete the packaged semiconductor device.

By far the most common manner of forming a plastic package about a semiconductor device assembly is molding and, more specifically, transfer molding. In this process, with specific reference to a LOC type semiconductor die assembly, a semiconductor die is suspended by its active surface from the underside of inner lead extensions of a lead frame (typically Cu or Alloy 42) by a tape, screen print or spin-on dielectric adhesive layer. The bond pads of the die and the inner lead ends of the frame are then electrically connected by wire bonds (typically Au, although Al and other metal alloy wires have also been employed) by means known in the art. The resulting LOC die assembly, which may comprise the framework of a dual-in-line package (DIP), zig-zag in-line package (ZIP), small outline j-lead package (SOJ), quad flat pack (QFP), plastic leaded chip carrier (PLCC), surface mount device (SMD) or other plastic package configuration known in the art, is placed in a mold cavity and encapsulated in a thermosetting polymer which, when heated, reacts irreversibly to form a highly cross-linked matrix no longer capable of being re-melted.

The thermosetting polymer generally is comprised of three major components: an epoxy resin, a hardener (including accelerators), and a filler material. Other additives such as flame retardants, mold release agents and colorants are also employed in relatively small amounts. While many variations of the three major components are known in the art, the focus of the present invention resides in the filler materials employed and their effects on the active die surface.

Filler materials are usually a form of fused silica, although other materials such as calcium carbonates, calcium silicates, talc, mica and clays have been employed for less rigorous applications. Powdered, fused quartz is currently the primary filler used in encapsulants. Fillers provide a number of advantages in comparison to unfilled encapsulants. For example, fillers reinforce the polymer and thus provide additional package strength, enhance thermal conductivity of the package, provide enhanced resistance to thermal shock, and greatly reduce the cost of the polymer in comparison to its unfilled state. Fillers also beneficially reduce the coefficient of thermal expansion (CTE) of the composite material by about fifty percent in comparison to the unfilled polymer, resulting in a CTE much closer to that of the silicon or gallium arsenide die. Filler materials, however, also present some recognized disadvantages, including increasing the stiffness of the plastic package, as well as the moisture permeability of the package.

When a heat sink is used on a semiconductor device assembly package, encapsulation of the semiconductor device becomes more difficult during the transfer molding process. In the first instance, the inclusion of the heat sink along with the semiconductor device attached to the lead frame makes the transfer molding of the assembly more difficult as more components must be placed and aligned within the mold cavity. Misalignment of the semiconductor device and the heat sink within the mold cavity may cause bleeding and flashing of the resin molding compound over the heat sink. Furthermore, when the heat sink, which is usually copper or an alloy thereof, rests against the mold surface during the transfer molding process, damage to the mold surface can occur by the mold surface being scratched and/or worn from contact therewith by the heat sink. The resulting worn mold surfaces cause the resin molding compound to bleed and flash over the outside of the heat sink during the transfer molding process. This affects the ability of the heat sink to transfer heat to the surrounding environment during the operation of the semiconductor device as well as presenting a poor appearance of the molded semiconductor device assembly.

Accordingly, there is a need for an improved transfer molding process for packaging semiconductor devices having heat sinks associated therewith to help prevent or reduce the bleeding or flashing of the molding compound over portions of the heat sink during the transfer molding process of the semiconductor device assembly.

SUMMARY OF THE INVENTION

The present invention is directed to a semiconductor device assembly that includes a heat sink adjacent to a die. A dam positioned about the peripheral edges of the heat sink during the transfer molding process serves to help prevent damage to the mold and help prevent encapsulant packaging compound material from flowing onto the heat sink. The dam may be a resilient, non-metallic material. The dam may also be a protrusion created by, for example, stamping the heat sink from a sheet of material or stamping the bottom of the heat sink to form the dam thereon. The dam may include a suitable metal material, such as copper, copper alloys, etc., and a suitable non-metallic material, such as polyamides, and tape. The dam may be permanently connected to the heat sink or removed following packaging. The dam may be removed with heat or during an electrolytic deflash cycle or, if desired, mechanically. The invention may be employed in connection with various types of lead frame configurations or, when a lead frame is not used with a bare semiconductor device of the semiconductor device assembly.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

To more fully understand the present invention in the context of the prior art, a brief description of a transfer apparatus and method for forming a plastic package about a LOC die assembly is provided. The term "transfer" molding is descriptive of this process as the molding compound, once melted, is transferred under pressure to a plurality of remotely-located mold cavities containing semiconductor device assemblies to be encapsulated.

Figure 1:
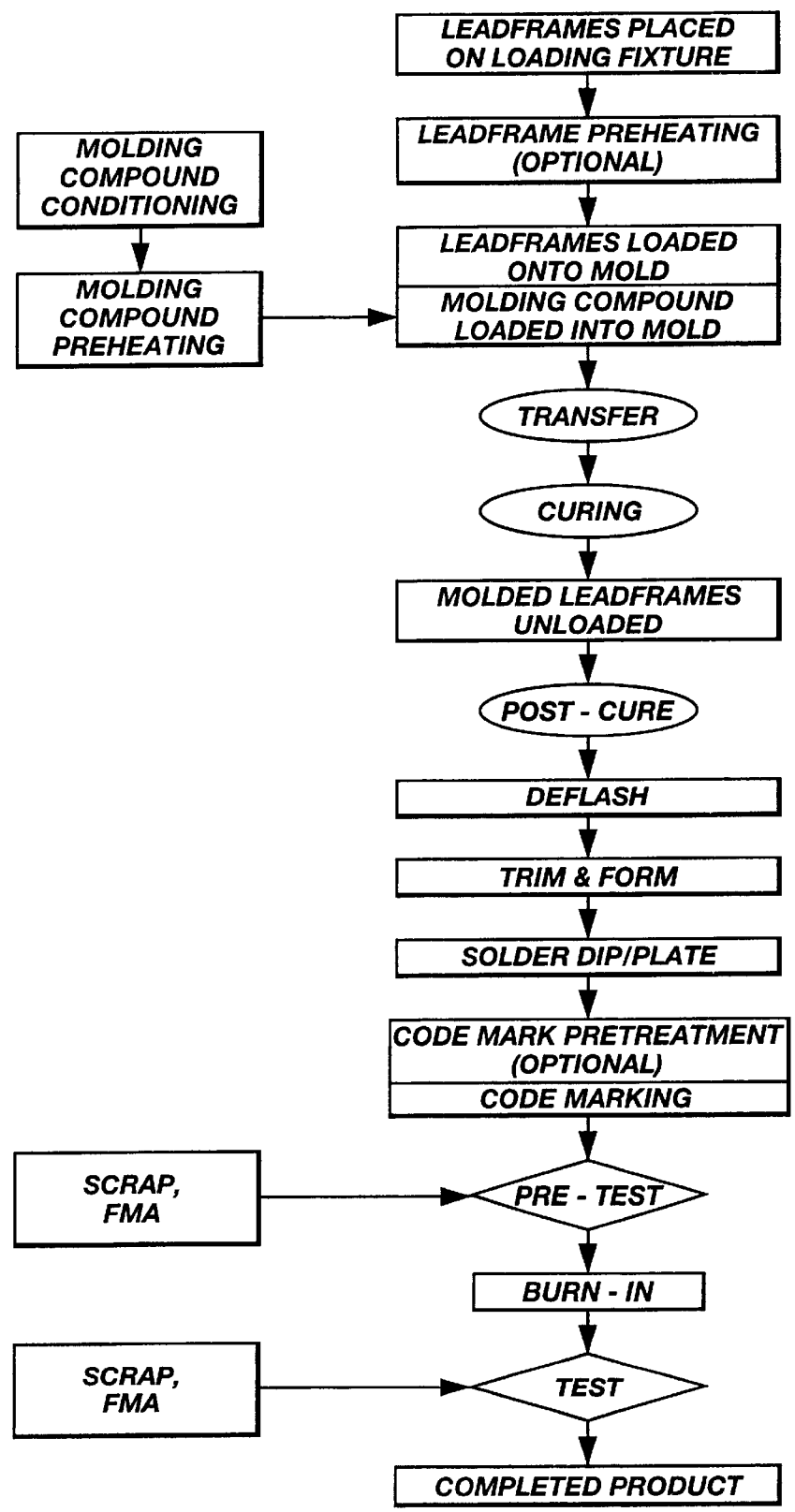
FIG. 1 comprises a flow chart of an exemplary process sequence for plastic package molding.

FIG. 1 is a flow chart of a typical process sequence for plastic package molding. It should be noted that the solder dip/plate operation has been shown as one step for brevity; normally, plating would occur prior to trim and form.

Figure 2A:
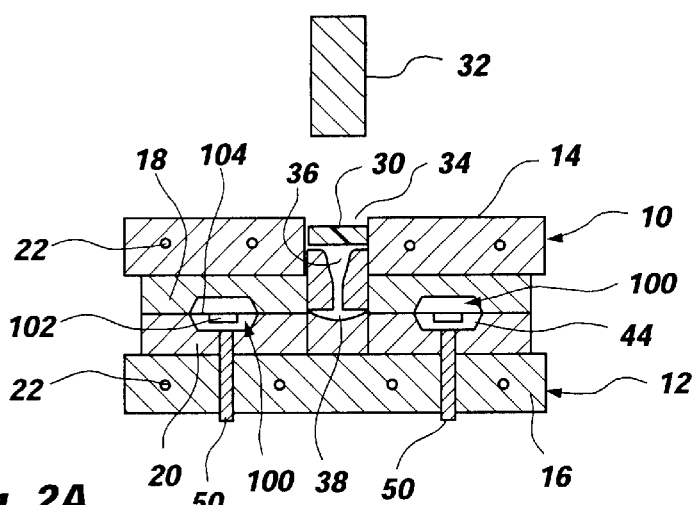
FIGS. 2A and 2B are side schematic views of a typical transfer molding, showing pre-molding and post-molding encapsulant positions.
Figure 2B:
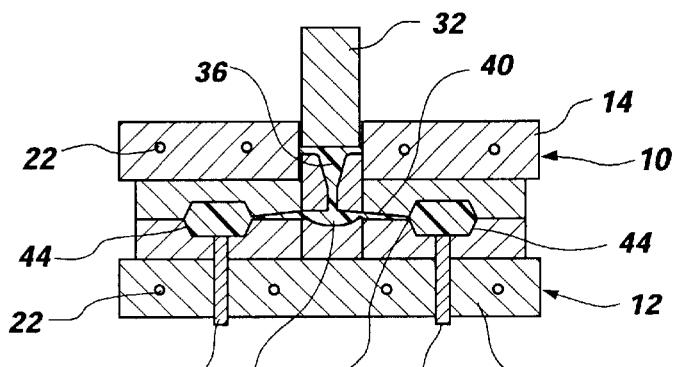

FIGS. 2A and 2B show pre-molding and post-molding positions of encapsulant during a transfer molding operation using a typical mold apparatus comprising upper and lower mold halves 10 and 12, each mold half including a platen 14 or 16 with its associated chase 18 or 20. Heating elements 22 are employed in the platens to maintain an elevated and relatively uniform temperature in the runners and mold cavities during the molding operation.

Figure 3:
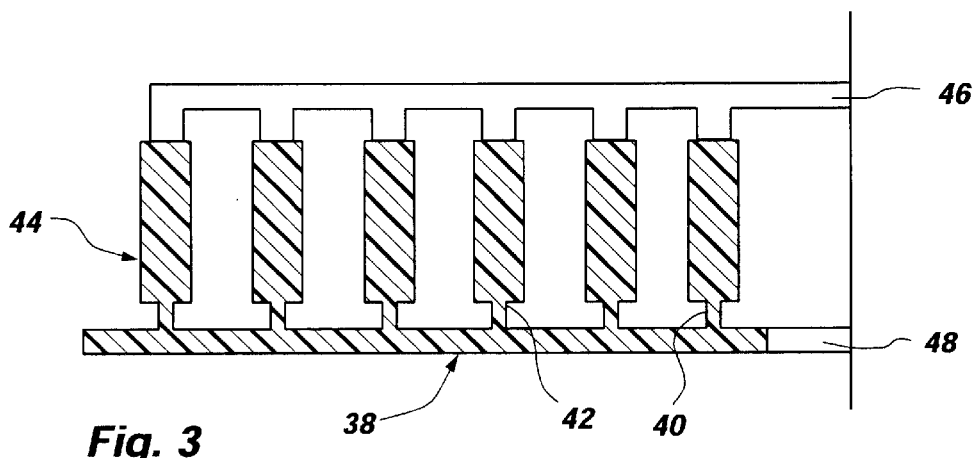
FIG. 3 shows a top schematic view of one side of a transfer mold of FIGS. 2A and 2B, depicting encapsulant flow and venting of the primary mold runner and the mold cavities wherein the semiconductor device assemblies are contained.

FIG. 3 shows a top view of one side of the transfer mold apparatus of FIGS. 2A and 2B. In the transfer mold apparatus shown, the encapsulant flows into each mold cavity 44 through the short end thereof.

In operation, a heated pellet of resin mold compound 30 is disposed beneath ram or plunger 32 in pot 34. The plunger descends, melting the pellet and forcing the melted encapsulant down through sprue 36 and into primary runner 38, from and through the mold cavities 44 through the short side thereof flowing across the semiconductor device assemblies 100, wherein semiconductor device assemblies 100 comprising semiconductor devices 102 with attached lead frames 104 are disposed (usually in strips so that a strip of six lead frames, for example, would be cut and placed in and across the six cavities 44 shown in FIG. 3). Air in the runners 42 (see FIG. 3) and 40 and mold cavities 44 is vented to the atmosphere through vents 46 and 48. At the end of the molding operation, the encapsulant is "packed" by application of a high pressure to eliminate voids and reduce non-uniformities of the encapsulant in the mold cavities 44. After molding, the encapsulated semiconductor device assemblies 100 are ejected from the cavities 44 by ejector pins 50, after which they are post-cured at an elevated temperature to complete cross-linking of the resin, followed by other operations as known in the art and set forth in FIG. 1, by way of example. It will be appreciated that other transfer molding apparatus configurations, as well as variations in the details of the described method are known in the art. However, none of such are pertinent to the invention, and so will not be discussed herein.

Figure 4A:
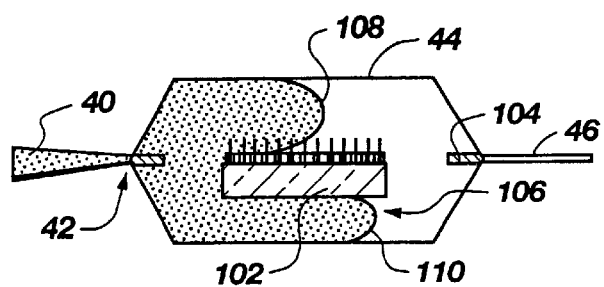
FIGS. 4A, 4B, and 4C depict encapsulant flow scenarios for a mold cavity.

Encapsulant flow in the mold cavities 44 is demonstrably non-uniform. The presence of the semiconductor device assembly 100 comprising a semiconductor device 102 with lead frame 104 disposed across the mid-section of a cavity 44 splits the viscous encapsulant flow front 106 into upper 108 and lower 110 components (FIG. 4A). Further, the presence of the (relatively) large semiconductor device 102 with its relatively lower temperature in the middle of a cavity 44 permits the flow front 106 on each side of the semiconductor device to advance ahead of the front which passed over and under the semiconductor device 102.

Figure 4B:
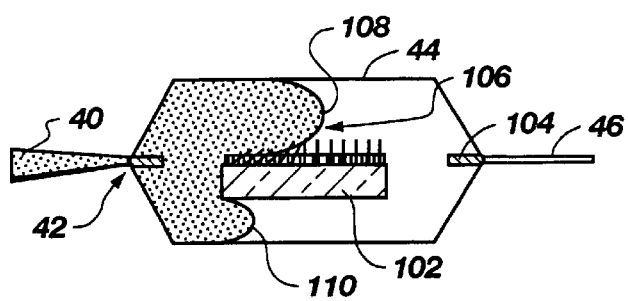
Figure 4C:
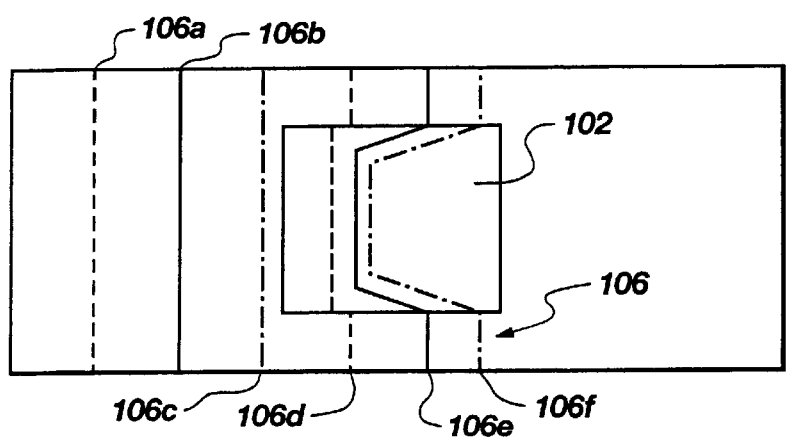

FIGS. 4A and 4B show two mold cavity encapsulant flow scenarios where, respectively, the lower flow front 110 and the upper flow front 108 lead the overall encapsulant flow front 106 in the cavity 44 containing the semiconductor device assembly 100. FIG. 4C depicts the advance of a flow front 106 from above, before and after a die 102 is encountered, the flow being depicted as time-separated instantaneous flow fronts 106a, 106b, 106c, 106d, 106e, and 106f. As the encapsulant flow front advances and the mold operation is completed by packing the cavities, encapsulant pressure in substantially all portions of the cavities reaches hydrostatic pressure.

Figure 5:
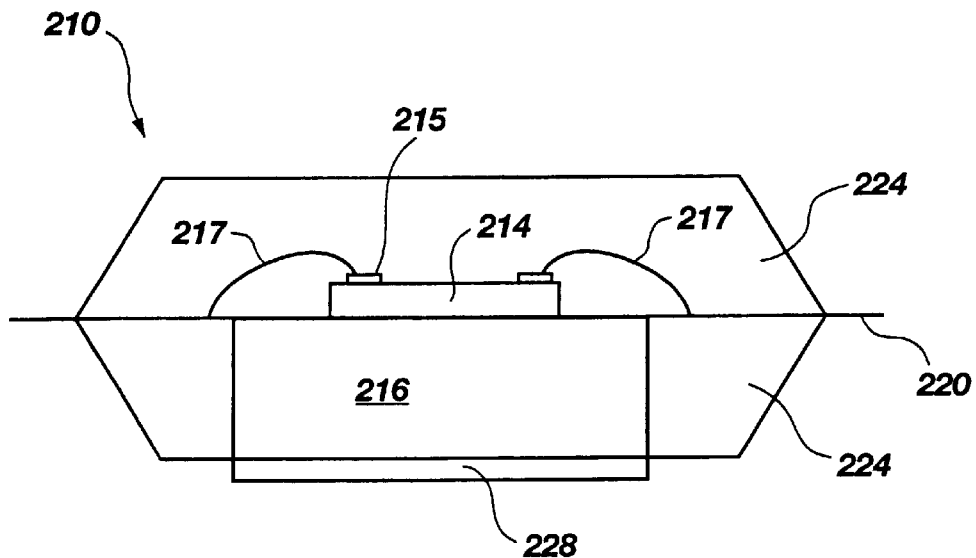
FIG. 5 is a side view of a semiconductor device including a heat sink, a dam, a die, and packaging compound.

Referring to FIG. 5, a semiconductor device assembly 210 includes a semiconductor device 214 having bond pads 215 located thereon interconnected to a lead frame 220 by one or more wire bonds 217 and a heat sink 216 adjacent to the semiconductor device 214. The semiconductor device 214 may be separated, if desired, from heat sink 216 through a portion of the lead frame 220. Various types of lead frame arrangements of the lead frame 220 may be employed, such as conventional type lead frames or Leads-Over-Chip (LOC) type lead frames, for example. Alternatively, a lead frame is not required with the semiconductor device 214 being connected to the heat sink 216 and encapsulated, except for the active surface of the semiconductor device 214 having bond pads 215 thereon. After the encapsulation of the lead frame 220, semiconductor device 214, and heat sink 216 during the transfer molding process, the encapsulant compound material 224 surrounds the semiconductor device 214 and heat sink 216, except where prevented from doing so by the dam 228. A dam 228 is positioned at the peripheral edges of heat sink 216 which prevents the flow of encapsulant molding material from bleeding over or flashing around the heat sink 216 during the encapsulation of the lead frame 220, semiconductor device 214, and heat sink 216 in the molding process in the transfer molding apparatus described hereinbefore.

Figure 6:
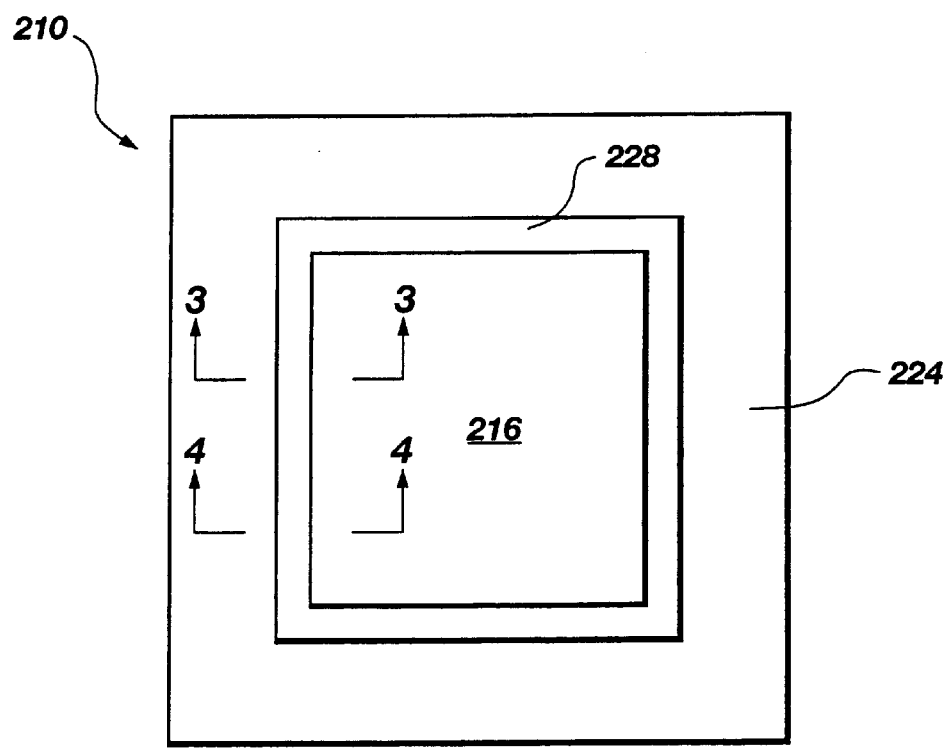
FIG. 6 is a bottom view of the device of FIG. 5.

FIG. 6 shows a bottom view of semiconductor device assembly 210. As seen in FIG. 6, dam 228 preferably extends substantially around the peripheral edges of the bottom of the heat sink 216. During a transfer molding process, dam 228 serves two purposes: (1) the dam 228 prevents damage to the mold and (2) the dam 228 prevents encapsulant molding (packaging) compound material 224 from flowing (i.e., bleeding or flashing) onto heat sink 216.

Figure 7:
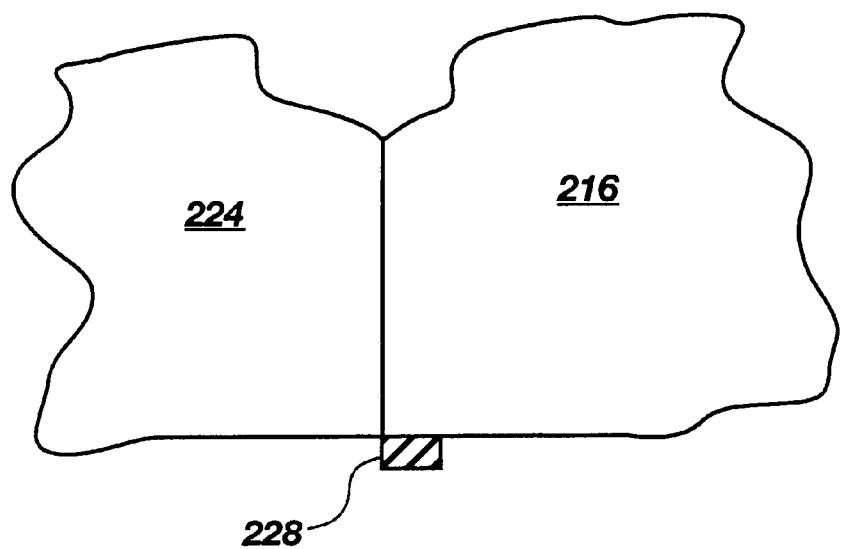
FIG. 7 is a first embodiment of the device of FIG. 5, taken along lines 3—3 of FIG. 6 in which the dam is a gasket.

Referring to FIG. 7, dam 228 may be a suitable resilient material or a gasket formed of suitable material which is suitable for such use and which is suitable for use in the transfer molding process, such as polyamides, Kapton™ tape, etc. The resilient material forming the dam 228 may be applied to the periphery of the bottom of the heat sink 216 by a molding operation, such as molding a suitable plastic material dam 228 about the periphery of the heat sink 216.

Figure 8:
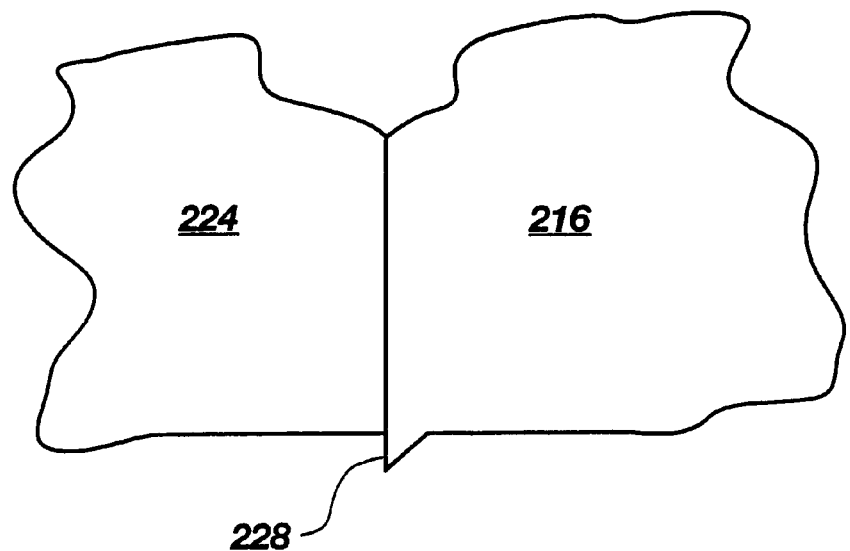
FIG. 8 is a second embodiment of the device of FIG. 5, taken along lines 4—4 of FIG. 6 in which the dam is a burr.

Referring to FIG. 8, dam 228 may also be a protrusion or substantially continuously formed burr type edge or lip extending around the periphery of the bottom surface of the heat sink 216 created, for example, through the stamping of the heat sink 216 from a sheet of material or, alternately, by the stamping of the bottom of heat sink 216 to form the protrusion thereon.

Figure 9:
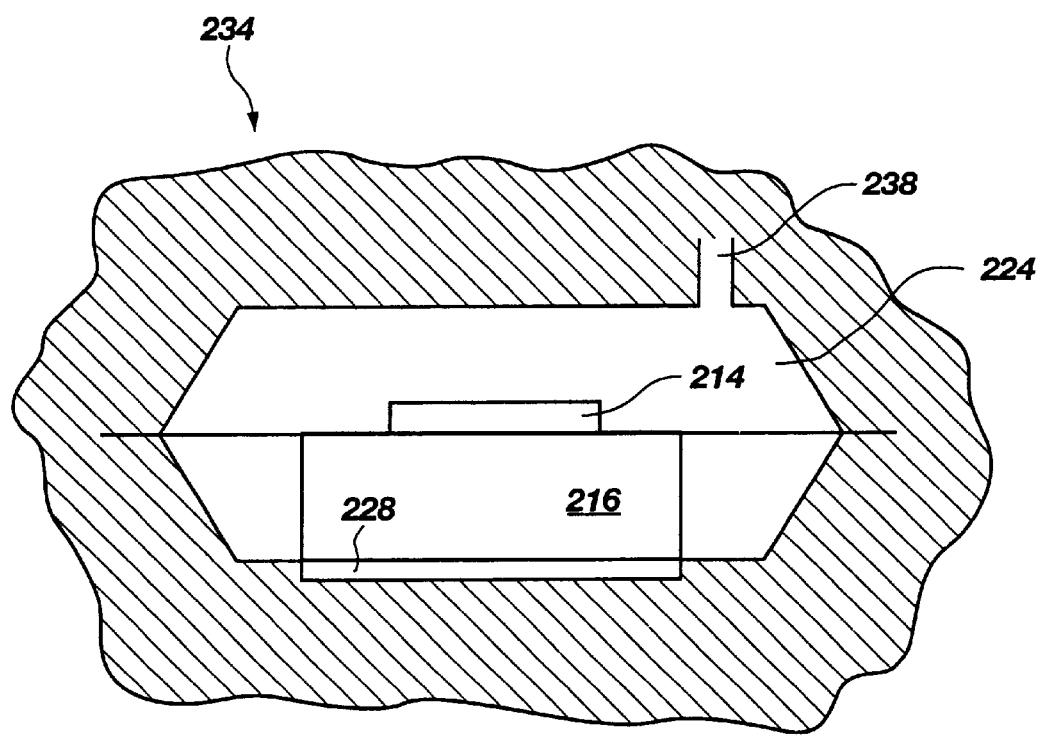
FIG. 9 is a side view of a mold and a die, lead frame, heat sink, and dam positioned therein.
Figure 2A:
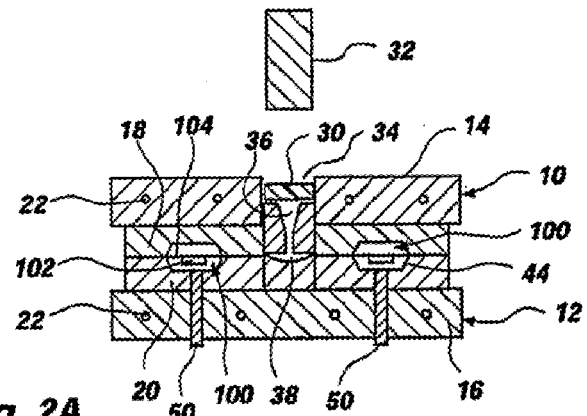
Figure 2B:
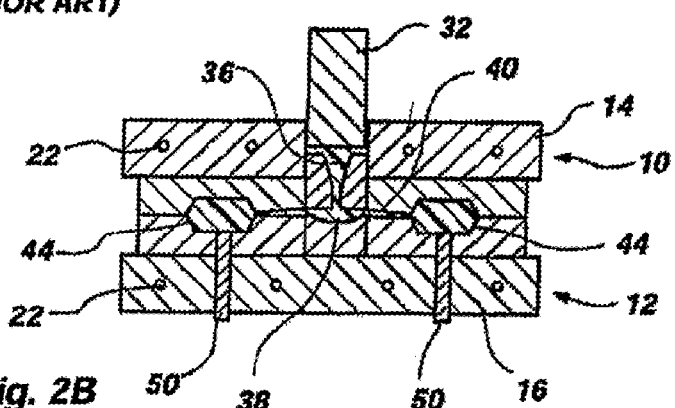
Figure 3:
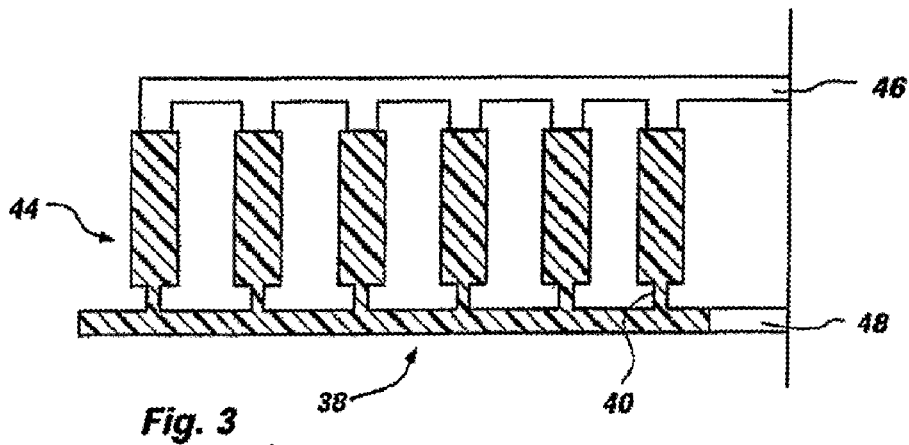
Figure 4A:
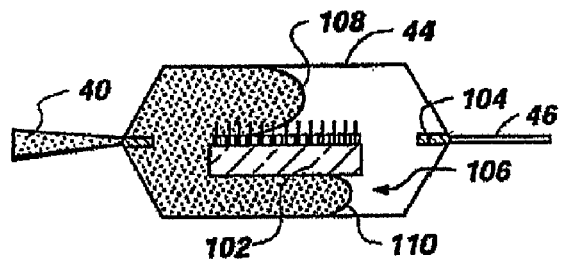
Figure 4B:
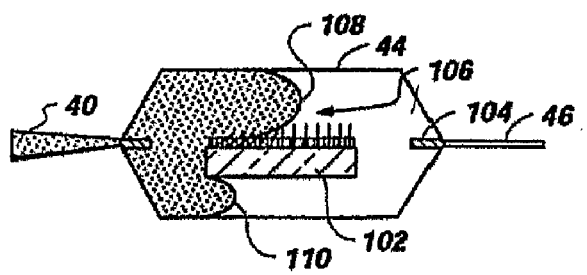
Figure 4C:
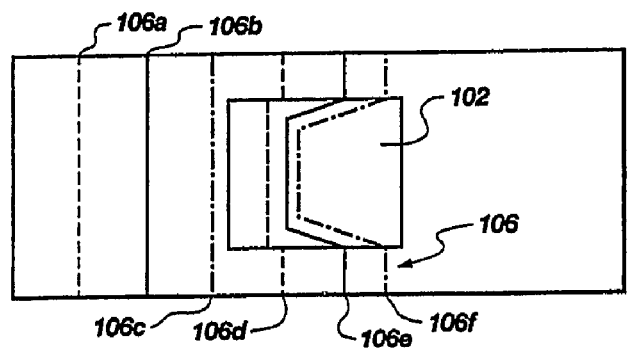

FIG. 9 shows a mold 234 to encase encapsulant compound material 224 that is received through an encapsulant compound source 238 during the transfer molding process as described hereinbefore.

Dam 228 prevents encapsulant compound material 224 from flashing or bleeding over the outside of heat sink 216. Flashing or bleeding occurs due to a combination of high pressure used in the molding process and the inherent inconsistency in the flatness of the mold and the heat sink. When the compound bleeds over the heat sink, the heat sink becomes less effective due to a loss in exposed surface area of the heat sink.

Dam 228 may include any suitable metal, such as copper, aluminum, copper alloys, aluminum alloys, etc., polyamides, and leadlock tape. Leadlock tape may consist of a Kapton™ carrier film and have an adhesive coating or material thereon. (See FIG. 7.) These materials are softer and would probably form more of a gasket than would copper, thereby resulting in less resin bleed and a longer mold life. In such a case, the dam material would not have to have good adhesion to encapsulant compound material 224 or heat sink 216 since dam 228 only needs to be present during the molding process. Dam 228 may be permanently connected to the heat sink or removed following packaging. Dam 228 may be removed with heat or during an electrolytic deflash cycle.

As used herein, the term "adjacent" does not necessarily mean touching. For example, a heat sink may be adjacent to a die, although separated from the die by a lead frame. Further, the term "connected" or a related term does not necessarily mean directly connected but could include being indirectly connected.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. In a combination of a semiconductor die in a molding apparatus, said molding apparatus having an upper mold half and a lower mold half, comprising:

said upper mold half of said molding apparatus having a cavity formed therein;

said lower mold half of said molding apparatus having a cavity formed therein having a first portion and having a second portion below the first portion;

a semiconductor die having an upper surface and a lower surface, the semiconductor die located in at least a portion of the cavity of the upper mold half;

a heat sink having an upper surface connected to the lower surface of the semiconductor die and having a lower surface having a periphery, the heat sink located in at least a portion of the first portion of the cavity in the lower mold half, said heat sink comprising a metal material; and a dam connected to the heat sink, the dam located on the lower surface of the heat sink, extending around the periphery thereof and extending from the periphery of the lower surface of the heat sink into at least a portion of the second portion of the cavity in the lower mold half, said dam openly communicating with the lower mold half.

2. The combination of claim 1, wherein the dam includes a gasket.

3. The combination of claim 1, further comprising:

a lead frame located adjacent to the semiconductor die.

4. The combination of claim 1, wherein the heat sink and the dam each comprise a material including copper, aluminum, or alloys thereof.

5. The combination of claim 1, wherein the dam comprises a material including copper.

6. The combination of claim 1, wherein the dam comprises a material including polyamide material.

7. The combination of claim 1, wherein the dam comprises a material including leadlock tape material.

8. The combination of claim 7, wherein the leadlock tape material includes a polyamide carrier film and an adhesive material.

9. A semiconductor device assembly encapsulated in a material in a molding apparatus having an upper mold half and lower mold half, said upper mold half and lower mold half each having a cavity formed therein, comprising:

a semiconductor die having an upper surface and a lower a surface;

a heat sink located in one of said upper mold half and lower mold half of said molding apparatus, the heat sink having an upper surface and a lower surface, each of the upper surface and the lower surface having a periphery, one of the upper surface and the lower surface for contacting one of the upper surface and the lower surface of the semiconductor die, said heat sink comprising a metal material; and a dam located adjacent the heat sink for contacting one of the upper surface and the lower surface of the semiconductor die, the dam located at the periphery of one of the upper surface and the lower surface of the heat sink and located adjacent the material, said dam for openly communicating with an environment in the lower mold half.

* * * * *

UNITED STATES PATENT AND TRADEMARK OFFICE
CERTIFICATE OF CORRECTION

| | | |
|---|---|---|
| PATENT NO. | : 6,583,504 B2 | Page 1 of 3 |
| APPLICATION NO. | : 10/077451 | |
| DATED | : June 24, 2003 | |
| INVENTOR(S) | : Richard W. Wensel | |

It is certified that error appears in the above-identified patent and that said Letters Patent is hereby corrected as shown below:

In the drawing sheets, delete Figures 2B, 3, 4A and 4B and replace as shown in the attached sheets.

In the specification:
 COLUMN 4, LINE 32, before "(see FIG. 3)" change "42" to --38--
 COLUMN 4, LINE 64, change "die 102" to --device 102--

In the claims:
CLAIM 9, COLUMN 7, LINE 1, after "and" and before "lower" (second occurrence) insert --the--
CLAIM 9, COLUMN 7, LINE 4, before "surface" delete "a"
CLAIM 9, COLUMN 7, LINE 6, before "lower" insert --the--

Signed and Sealed this

Twenty-third Day of October, 2007

JON W. DUDAS
*Director of the United States Patent and Trademark Office*